(12) United States Patent
Kondo

(10) Patent No.: US 7,298,166 B2
(45) Date of Patent: Nov. 20, 2007

(54) LOADING DEVICE

(75) Inventor: Toyoshi Kondo, Tokyo (JP)

(73) Assignee: Tatsumi Corporation, Tokyo (JP)

( * ) Notice: Subject to any disclaimer, the term of this patent is extended or adjusted under 35 U.S.C. 154(b) by 449 days.

(21) Appl. No.: 10/977,296

(22) Filed: Oct. 28, 2004

(65) Prior Publication Data

US 2005/0093522 A1    May 5, 2005

(30) Foreign Application Priority Data

Oct. 29, 2003 (JP) ............................. 2003-369487
Jul. 15, 2004 (JP) ............................. 2004-209015

(51) Int. Cl.
*G01R 31/36* (2006.01)
(52) U.S. Cl. ..................................... 324/771
(58) Field of Classification Search ............... None
See application file for complete search history.

(56) References Cited

U.S. PATENT DOCUMENTS

| | | | | |
|---|---|---|---|---|
| 3,065,156 A | * | 11/1962 | Thompson et al. | 204/543 |
| 3,341,441 A | * | 9/1967 | Giuffrida et al. | 204/525 |
| 3,376,501 A | * | 4/1968 | Peranio | 324/450 |
| 3,652,431 A | * | 3/1972 | Reynolds | 205/338 |
| 3,779,014 A | * | 12/1973 | Nohira et al. | 60/286 |
| 4,058,446 A | * | 11/1977 | Zirino et al. | 204/409 |
| 4,085,028 A | * | 4/1978 | McCallum | 204/269 |
| 4,391,841 A | * | 7/1983 | Zeblisky | 427/99.5 |
| 4,755,267 A | * | 7/1988 | Saunders | 205/726 |
| 4,910,457 A | * | 3/1990 | Matsumoto | 324/772 |
| 5,250,924 A | | 10/1993 | Kondoh | 338/56 |
| 6,516,905 B1 | | 2/2003 | Baumert et al. | 180/53.8 |

FOREIGN PATENT DOCUMENTS

| | | |
|---|---|---|
| EP | 0280803 | 9/1988 |
| GB | 155157 | 12/1920 |
| JP | 08-321408 | 12/1996 |

* cited by examiner

*Primary Examiner*—Ernest Karlsen
*Assistant Examiner*—Richard Isla-Rodas
(74) *Attorney, Agent, or Firm*—J.C. Patents

(57) ABSTRACT

A loading device for conducting a loading test of an objective power source to be tested comprises a rectifier connected to the objective power source to be tested and a resistor connected to the rectifier, the resistor including a retention tank for collecting electrolyte aqueous solution and an electrode member soaked in the electrolyte aqueous solution, a positive electrode of direct current from the rectifier being connected to the retention tank, and a negative electrode of the direct current being connected to the electrode member, and a hydrogen collecting member forming a first space shielded from air being disposed upward in a periphery of the electrode member.

9 Claims, 9 Drawing Sheets

Prior Art

LOADING DEVICE

BACKGROUND OF THE INVENTION

1. Field of the Invention

The present invention relates to a loading test device used for an electric loading test of an alternating-power generator and another power source, for example, and a loading device used for load stabilization of a cogeneration system.

2. Related Art Statement

In facilities or buildings requiring electric power such as a factory, department store, computerized building, medical agency, commercial building, and waterworks department, stabilized electric power supply is required even in the case of electric power outage. Therefore, in such facilities, a private electric generator such as a three-phase alternating-current generator is disposed, and electric power can be supplied to the facilities by activating the private electric generator when electric power outage occurs, so that the electric power can be stably supplied even in the case of electric power outage.

Such a private electric generator is not for regular operation. The use of such a private electric generator is limited in the case of electric power outage; in addition, the private generator is required to certainly operate at that time. Therefore, it is required to regularly conduct a loading test on regular basis in order to normally activate the private electric generator in the case of emergency such as electric power outage.

As a method for a loading test of this private electric generator, it is preferable to conduct the loading test by supplying the electric power generated by actually activating the private electric generator to devices (electricity consumption devices such as an interior illumination and air conditioner), which are disposed in the facilities and actually uses the electric power. However, in many cases, the loading test requires a lot of times; moreover, since some dozen times of test for turning on and off a power source of electric generator and test for rapid increase in the capacity of electric power are conducted, it is difficult to conduct the loading test by using the electricity consumption devices disposed in the facilities.

Accordingly, in fact, the loading test of the private electric generator is carried out by using a resistor or loading test device for a loading test including loading resistance having a capacity compatible with the capacity of the electric generator.

A water rheostat has been widely used as the resistor included in this loading test device. In the water rheostat, electrodes are inserted in a tank comprising concrete or a wood flame, and the water rheostat adjusts the load by regulating the inserted amount or the interval between the electrodes. Generally, the water rheostat stabilizes the load while feeding with water, and also adjusts the water temperature by supplementing the vaporized water.

A loading test device 1 shown in FIG. 11 has been conventionally know as the loading test device using such a water rheostat (for example, reference to JP-A-H08-321408).

The loading test device 1 comprises a water rheostat 2 including three cylindrical-shaped electrodes 2a, 2a, 2a, a cooling water supply source for supplying cooling water, and a deionizer 4 including ion-exchange resin.

The water rheostat 2 comprises a retention tank 2b in which the water is collected, and the cylindrical-shaped electrode 2a is soaked in the water M collected in the retention tank 2b. This cylindrical-shaped electrode 2a it connected to an electric generator (not shown) of a test object. The upper portion of the retention tank 2b is provided with an outlet head 2c, so that the water M in the retention tank 2b is maintained in a constant height.

The cooling water supply source 3 is connected to the retention tank 2b through a supply pipe 5, so that the cooling water from the cooling water supply source 3 is supplied in the retention tank 2b. This supply pipe 5 comprises a first pipe portion 5a leading from the cooling water supply source 3 directly to the retention tank 2b, and a second pipe portion 5b leading to the retention tank 2b through the deionizer 4.

When the loading test is performed by the conventional loading test device 1 having the above construction, the loading test is carried out by adjusting fixed resistance of water in the retention tank 2b within a predetermined range. More particularly, the fixed resistance of water M in the retention tank 2b is adjusted within a predetermined range by mixing the water directly supplied from the cooling water supply source 3 and the water having high fixed resistance through the purified water device 4.

Recently, there has been an important issue of energy saving, so there has been an increasing demand for conducting electric power saving in every electric facility regardless of its scale or kind.

However, in the conventional loading test device 1, there have been some problems such as electric power loss and difficulty in an exhaust heat treatment in the water rheostat 2. In other words, since the electric power was consumed as the heat in the water rheostat 2, this electric power was not used, so that the electric power was wasted. Especially, the loading test has been performing in various power generating units throughout the year, so that there is a problem that the amount of electric power which is abandoned is enormous.

Furthermore, there was a large problem of a treatment for the generated heat (exhaust heat treatment) in the conventional load testing device 1. More particularly, in the load testing device 1, because the electric power was converted into the heat in the water rheostat 2, the temperature of water M was raised. Therefore, the increase in the water temperature of the water M was controlled by pouring a large amount of cooling water into the retention tank 2b. However, when the increase in the water temperature was prevented as described above, a large amount of cooling water was required; furthermore, there was a problem that the treatment of generated warm water was difficult.

The above problem was common for the loading stabilization device for stabilizing the loading of the cogeneration system, for example. That is, in the loading stabilization device of the cogeneration system, there was a problem that the electric power was consumed as the exhaust heat.

SUMMARY OF THE INVENTION

It is, therefore, the present invention has been made to solve the aforementioned problems, and objects of the present invention to use electric power consumed in a loading device used for a loading stabilization device of a cogeneration system and a loading test device of a power source, and to control burden according to an exhaust heat treatment.

In order to solve the aforementioned problems, the present invention provides a loading device for conducting a loading test of an objective power source to be tested, comprising a rectifier connected to the objective power source to be tested and a resistor connected to the rectifier, the resistor, including a retention tank for collecting electrolyte aqueous solution and an electrode member soaked in the electrolyte aqueous solution, wherein a positive electrode of direct current from the rectifier is connected to the retention tank, and a negative electrode of the direct current is connected to the electrode member, and a hydrogen collecting member forming a first space shielded from air is disposed upward in a periphery of the electrode member.

According to the present invention, the loading device further comprises a plurality of rectifiers and a plurality of electrode members corresponding to the plurality of rectifiers.

According to the present invention, the loading device further comprises a hydrogen storage device to store hydrogen collected by the hydrogen collecting member.

According to the loading device of the present invention, the hydrogen storage device includes a hydrogen storage alloy.

According to the loading device of the present invention, an ion-exchange membrane member surrounding the electrode member is disposed in an outside of the hydrogen collecting member.

According to the loading device of the present invention, a portion of the electrode member soaked in the electrolyte aqueous solution is formed in a hollow net-like shape.

According to the loading device of the present invention, the positive electrode is connected to a side wall of the retention tank, and an oxygen collecting member forming a second space shielded from the air is provided in an upside of an inside of the side wall.

According to the loading device of the present invention, the oxygen collecting member is the positive electrode including an upper wall part covering an upside of the electrolyte aqueous solution and a soaked portion which extends from the upper wall part to a lower side and soaks in the electrolyte aqueous solution.

According to the loading device of the present invention, the oxygen collecting member comprises the same electrode as the retention tank, the upper wall part is formed by a member similar to the hydrogen collecting member, and a portion of the soaked part soaked in the electrolyte aqueous solution is formed in a hollow net-like shape.

DETAILED DESCRIPTION OF THE PREFERRED EMBODIMENTS

The modes for carrying out the present invention will be described based on the following embodiment.

The embodiment of the present invention will be described with reference to the drawings.

Figure 1:
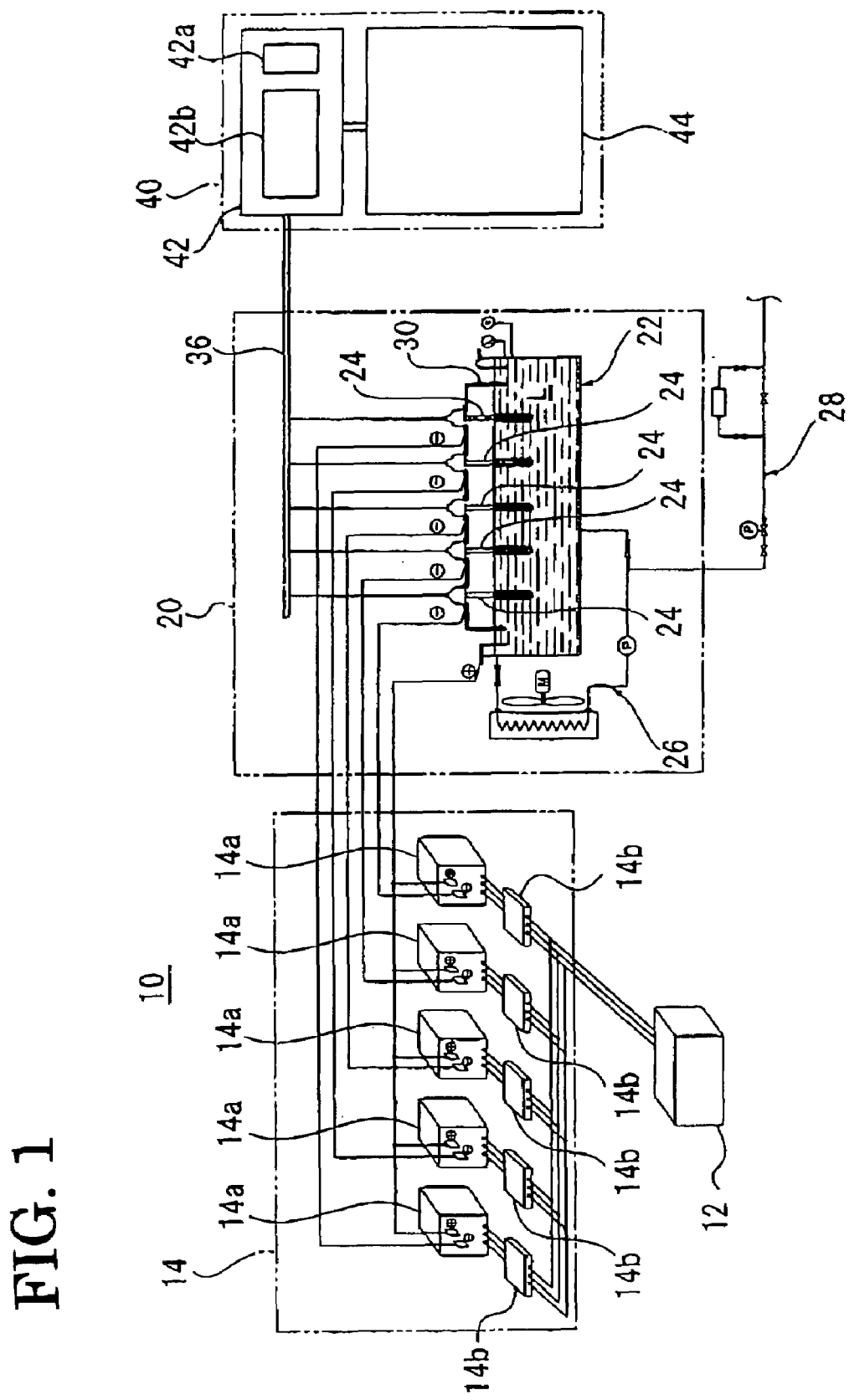
FIG. 1 is a block diagram schematically illustrating the loading device according to the embodiment of the present invention.

As illustrated in FIG. 1, a loading device 10 of the present invention comprises a rectifier unit 14 to be connected to an alternating-current generator 12 as an objective power source to be tested, a resistor 20 connected to the rectifier unit 14 and a hydrogen storage device 40 as a device for storing hydrogen.

The alternating-current generator 12 is disposed in facilities such as a factory or commercial building, for example, and operates when normal electric power transmission is cut. Therefore, the alternating-current generator 12 prevents the electric power outage of the facilities. Here, the loading device 10 is used as a loading test device for performing the loading test of the alternating-current generator 12.

The rectifier unit 14 comprises a plurality of rectifiers 14a for converting the alternating current from the alternating-current generator 12 into direct current. The plurality of rectifiers 14a is connected to the alternating current generator 12 through respective switching devices 14b.

Figure 2:
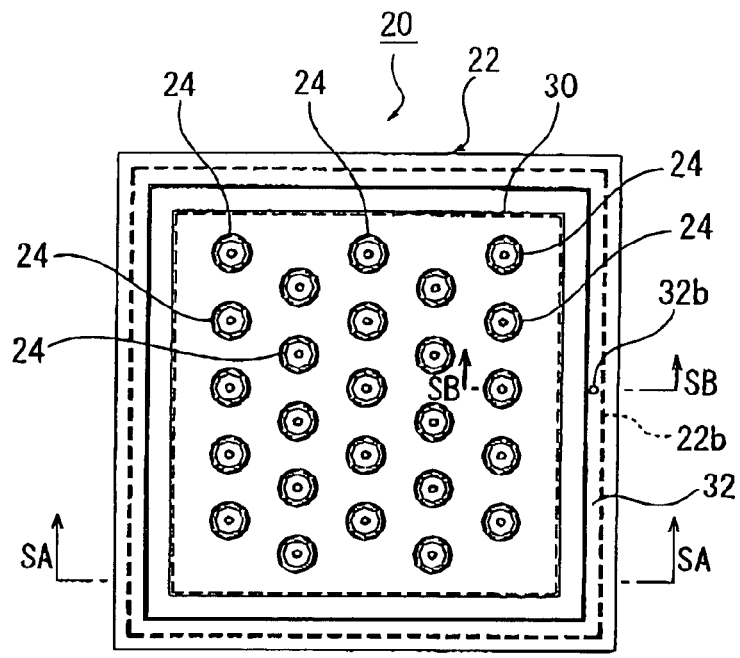
FIG. 2 is a plan view of the resistor included in the loading device according to the embodiment of the present invention.
Figure 3:
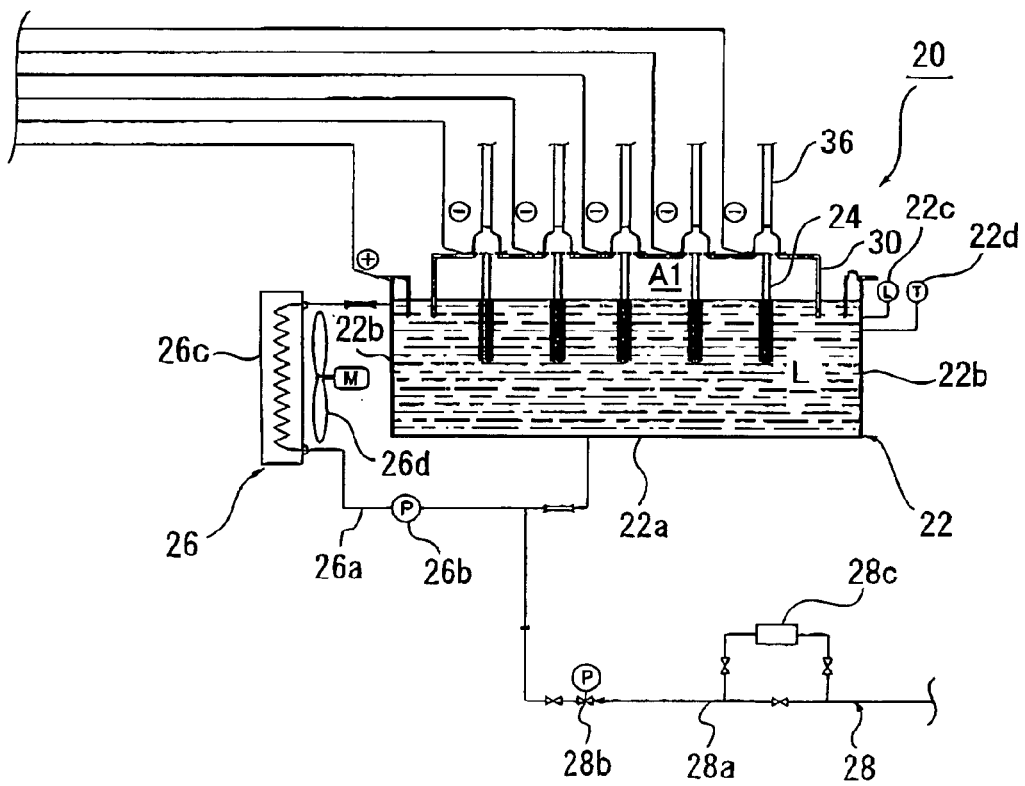
FIG. 3 is a schematic cross section view along SA-SA line in FIG. 2.

As shown in FIGS. 2, 3, the resistor 20 comprises a retention tank 22 in which electrolyte aqueous solution L is accumulated and an electrode tube or electrode member 24 suspending from above of the resistor 20.

The retention tank 22 opens the upper surface thereof, and includes a bottom plate 22a and a side wall 22b. The electrolyte aqueous solution L is accumulated in the retention tank 22. The retention tank 22 is provided with a liquid level detector 22c and a liquid temperature detector 22d including a floating (not shown). The liquid level and liquid temperature of the electrolyte aqueous solution L can be detected by the detectors 22c, 22d.

The retention tank 22 is also provided with a cooling device 26 of the electrolyte aqueous solution L and a hydration device 28 for replenishing reduced water. The hydration device 28 is provided with a deionizer 28c, so the fixed resistance of water can be stabilized by eliminating foreign substances of the supplied water. It is preferable for the water to be de-ionized water by this deionizer especially when extra-high voltage is applied.

The cooling device 26 comprises a circulation pipe 26a whose one end is connected to the side wall 22b and the other end is connected to the bottom plate 22a, a circulation pump 26b for circulating the electrolyte aqueous solution L, a radiator 26c connected to the circulation pump 26b through the circulation pipe 26a, and a radiator fan 26d for sending air to the radiator 26c. The cooling device 26 is connected to the liquid temperature detector 22d, so detection signals from the liquid temperature detector 22d are input to the cooing device 26.

In the resistor 20, the electrolyte aqueous solution L is circulated while running the radiator fan 26a, so the increase in the liquid temperature of the electrolyte aqueous solution L is prevented by radiating the heat of the electrolyte aqueous solution L with the radiator 26$c$. Especially, when the detection signal equal or more than a predetermined value is input to the cooling device 26, the temperature of the electrolyte aqueous solution L is maintained lower than a predetermined value by increasing the revolutions and amount of the circulating water of the radiation fan 26$d$.

The hydration device 28 comprises a supply pipe 28$a$ whose one end is connected to a water supply source (not shown) and the other end is connected to the circulation pipe 26$a$ and an electromagnetic valve 28$b$ connected to the supply pipe 28$a$.

The electromagnetic valve 28$b$ is electrically connected to the liquid level detector 22$c$, and the detection signals from the liquid level detector 22$c$ are input to the electromagnetic valve 28$b$. The opening and closing of the electromagnetic valve 28$b$ is thereby controlled, the electrolyte aqueous solution L in the retention tank 22 can be maintained at a predetermined liquid level.

Figure 4A:
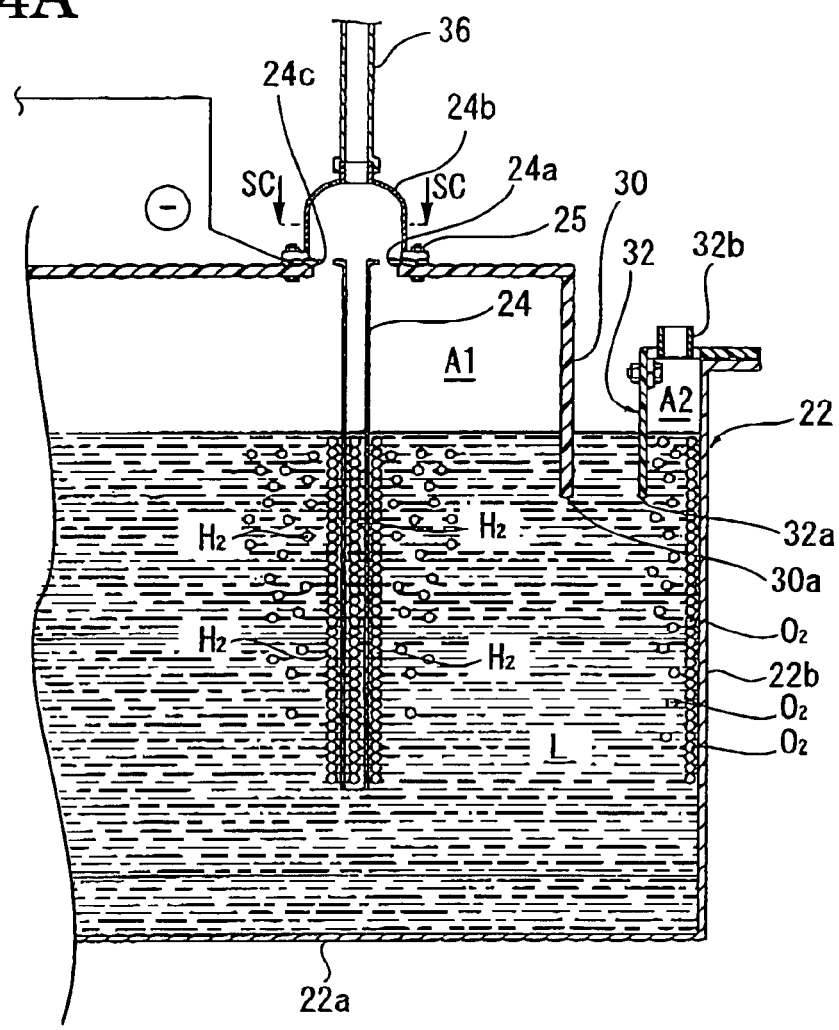
FIG. 4A is a cross section view along SB-SB line in FIG. 2.

On the other hand, the electrode tube 24 is made of a conductive material such as stainless steel, for example. As shown in FIG. 4A, the electrode tube 24 is a hollow-cylinder shape its one part is soaked in the electrolyte aqueous solution L. A plurality of electrode tubes 24 is disposed corresponding to a plurality of rectifiers 14$a$. The upper end of each electrode tube 24 is provided with a flange 24$a$. A negative (−) electrode of direct current from corresponding rectifier 14$a$ is connected to each flange 24$a$ as shown in FIG. 1. Therefore, the electrode tube 24 operates as a cathode.

Moreover, a hydrogen collecting member 30, which is fixed to the flange 24$a$ by a bolt 25, is provided upward in the periphery of electrode tube 24. The hydrogen collecting member 30 is made of a material having electric insulation and predetermined water resistance and heat resistance. As such a material, it is possible to choose from appropriate materials such as acrylic acid resin, epoxy resin, silicone resin, and melamine resin. If the hydrogen collecting member 30 is made of FRP (Fiber Reinforced Plastics), it is possible to have the lightweight hydrogen collecting member 30 having high heat resistance, chemical resistance, and high strength.

The hydrogen collecting member 30 is a rectangular solid shape whose lower surface is opened, and a lower end 30$a$ of the hydrogen collecting member 30 is absorbed in the electrolyte aqueous solution L. Therefore a space (first space) A1 shielded from air is formed.

Figure 4B:
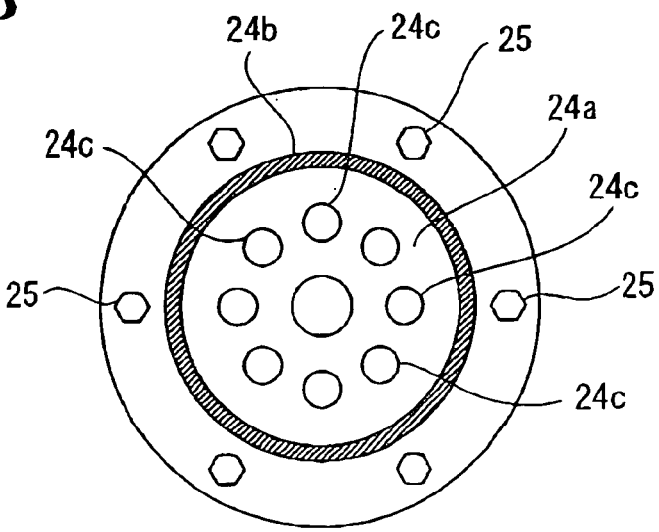
FIG. 4B is a schematic cross section view along SC-SC line in FIG. 4A.

A bowl-shaped junction member 24$b$ having an inverted U-section shape is provided directly on the electrode tube 24. As shown in FIG. 4B, the inside of this junction member 24$b$ is communicated with the space A1 by through-holes 24$c$ disposed in the hydrogen collecting member 30 and the flange 24$a$.

As shown in FIGS. 1, 3, a positive (+) electrode of direct current from the rectifier 14$a$ is connected to the upper end of the side wall 22$b$ of the retention tank 22. The retention tank 22 is made of a conductive material such as stainless steel, for example. Therefore, the retention tank 22 operates as anode.

The upper side of inner side of the side wall 22$b$ is provided with an oxygen collecting member 32 of an inverted L-section shape comprising an insulating material. A lower end 32$a$ of the oxygen collecting member 32 is absorbed in the electrolyte aqueous solution L; therefore, a space (a second space) shielded from air is formed.

This oxygen collecting member 32 is provided with an opening for taking out oxygen 32$b$; therefore, the oxygen stayed in the space A can be stored in an oxygen storing container (not shown).

The hydrogen storage device 40 is for storing the hydrogen $H_2$ generated in the resistor 20. The hydrogen storage device 40 comprises a hydrogen absorption device 42 connected to the junction member 24$b$ through an air-pipe 36 and a hydrogen dispenser unit 44 for taking out the stored hydrogen.

The hydrogen absorption device 42 includes hydrogen storage alloy (metal hydride) such as TiMnVFe, TiCrV, or $NaAlH_4$, for example and a temperature adjusting device 42$a$ for adjusting the temperature in the hydrogen absorption device 42.

The hydrogen $H_2$ is absorbed in the hydrogen storage alloy by lowering the temperature in the hydrogen absorption device 42 with the temperature adjusting device 42$a$. Accordingly, the hydrogen $H_2$ collected by the hydrogen collecting member 30 can be stored in the hydrogen storage device 40 through the junction member 24$b$ and the air-pipe 36.

The hydrogen dispenser unit 44 is appropriately provided with a compressor, flow meter, filling hose, and the like (not shown), and the stored hydrogen can be taken out by matching pressure and the like to the application.

In the hydrogen storage device 40, the hydrogen $H_2$ is emitted from the hydrogen storage alloy by increasing the temperature in the hydrogen absorption device 42 with the temperature adjusting device 42$a$, and then the hydrogen $H_2$ can be sent to the hydrogen dispenser unit 44.

Next, functions of the loading device 10 including the above construction will be described along a loading test method.

The alternating-current generator 12 as the objective power source to be tested disposed in, for example, a theater, factory, pump station, commercial building, or the like is connected to the rectifier unit 14 of the loading device 10.

The appropriate number of the switching devices 14$b$ is turned on in accordance with the scale and the test contents of the alternating-current generator 12. Accordingly, electric current can be applied (turning on electricity) to the rectifier 14$a$ corresponding to the number of the turned-on switching devices 14$b$, and then the electric current is applied to the electrode tube 24 corresponding to the rectifier 14 to which the current is applied. Therefore, the loading test of the alternating-current generator 12 can be carried out by using the load by the resistance of the resistor 20.

Here, in the loading device 10, the resistor 20 comprises the retention tank 22 for collecting the electrolyte aqueous solution L and the electrode tube 24 soaked in the electrolyte aqueous solution L. The positive electrode of the direct current from the rectifier 14$a$ is connected to the retention tank 22 and the negative electrode of the direct current is connected to the electrode tube 24, so that the electrolyte aqueous solution L can be decomposed by an electric current with the resistor 20 when the loading test of the alternating-current generator 12 is performed.

In other words, in the loading device 10, the retention tank 22 connected to the positive electrode of the direct current operates as the anode, and the electrode tube 24 connected to the negative electrode of the direct current operates as the cathode, so that the oxygen $O_2$ can be generated from the retention tank 22 and hydrogen $H_2$ can be generated from the electrode tube 24.

Since the loading device 10 is provided with a plurality of electrode tubes 24, which is connected to the negative electrodes of a plurality of rectifiers 14a one-on-one, the number of rectifiers 14 to be used can be appropriately selected in accordance with the scale or the test contents of the alternating-current generator 12. Accordingly, the appropriate electric current can be applied to the electrode tube 24, and the electrolysis of the electrolyte aqueous solution L can be carried out more effectively.

Moreover, the loading device 10 of the present invention is provided with the hydrogen collecting member 30 for forming the space A1 shielded from air in the upper side of the peripheral of the electrode tube 24, so that the hydrogen $H_2$ generated from the electrode tube 24 can be easily collected in the space A1 by the hydrogen collecting member 30, and the diffusion of heat to air can be controlled.

Therefore, according to the loading device 10, the hydrogen $H_2$ can be collected by using the electric power consumed in the resistor 20, so the electric power consumed in the resistor 20 can be used. More specifically, in the conventional loading test device, since the electric power was consumed as the heat by the water rheostat, the electric power was not used. However, in the present invention, the electric energy consumed in the water rheostat is converted in to the chemical energy, and this chemical energy can be used.

Moreover, in the loading device 10 of the present invention, most of the electric power consumed in the resistor 20 is used for the electrolysis of the water, so that the increase of temperature of the electrolyte aqueous solution L can be controlled. Therefore, a large amount of cooling water and the like for preventing the increase in the water temperature is not required, and the exhaust heat treatment can be conducted very easy.

The hydrogen storage device 40 stores the hydrogen $H_2$ collected by the hydrogen collecting member 30. In other words, the temperature adjusting device 42a cools the hydrogen absorption device 42; therefore, the hydrogen $H_2$ supplied to the hydrogen absorption device 42 through the air-pipe 36 is stored in the hydrogen storage alloy.

When this hydrogen $H_2$ is used, the hydrogen $H_2$ stored in the hydrogen storage alloy is emitted by warming the inside of the hydrogen storage device 42 with the temperature adjusting device 42, and the emitted hydrogen $H_2$ is supplied to an object to which the hydrogen $H_2$ is supplied such as a vehicle and fuel cell thought the dispenser unit 44.

As described above, if the hydrogen $H_2$ generated in the resistor 20 is stored in the hydrogen storage alloy, the hydrogen $H_2$ can be easily stored and also the hydrogen $H_2$ can be easily emitted. Therefore, the flexibility of the utilization of the hydrogen can be improved. In addition, the hydrogen storage alloy can absorb a large amount of hydrogen in the high density, and also can be easily transported because the hydrogen storage alloy can stably store highly explosive hydrogen, so that the hydrogen storage alloy is more practicable.

Since the retention tank 22 connected to the positive electrode of the direct current from the rectifier 14a operates as the anode, the oxygen $O_2$ generates from the retention tank 22. In this embodiment, the positive electrode is connected to the side wall 22b, so that most of the oxygen $O_2$ generated by the electrolysis generates from the side wall 22b.

Here, in the loading device 10 of the present invention, since the upper part of the inner side of the side wall 22b is provided with the oxygen collecting member 32 forming the space A shielded from air, the oxygen $O_2$ generated from the side wall 22b can be easily collected. The oxygen $O_2$ stayed in the space A2 is stored in the oxygen storage container (not shown) through the opening for taking out oxygen 32b.

As described above, according to the loading device 10, the oxygen $O_2$ generated by the electrolysis of the electrolyte aqueous solution L can be easily collected, so that the oxygen $O_2$ can be used.

APPLICATION EXAMPLE 1

Figure 5:
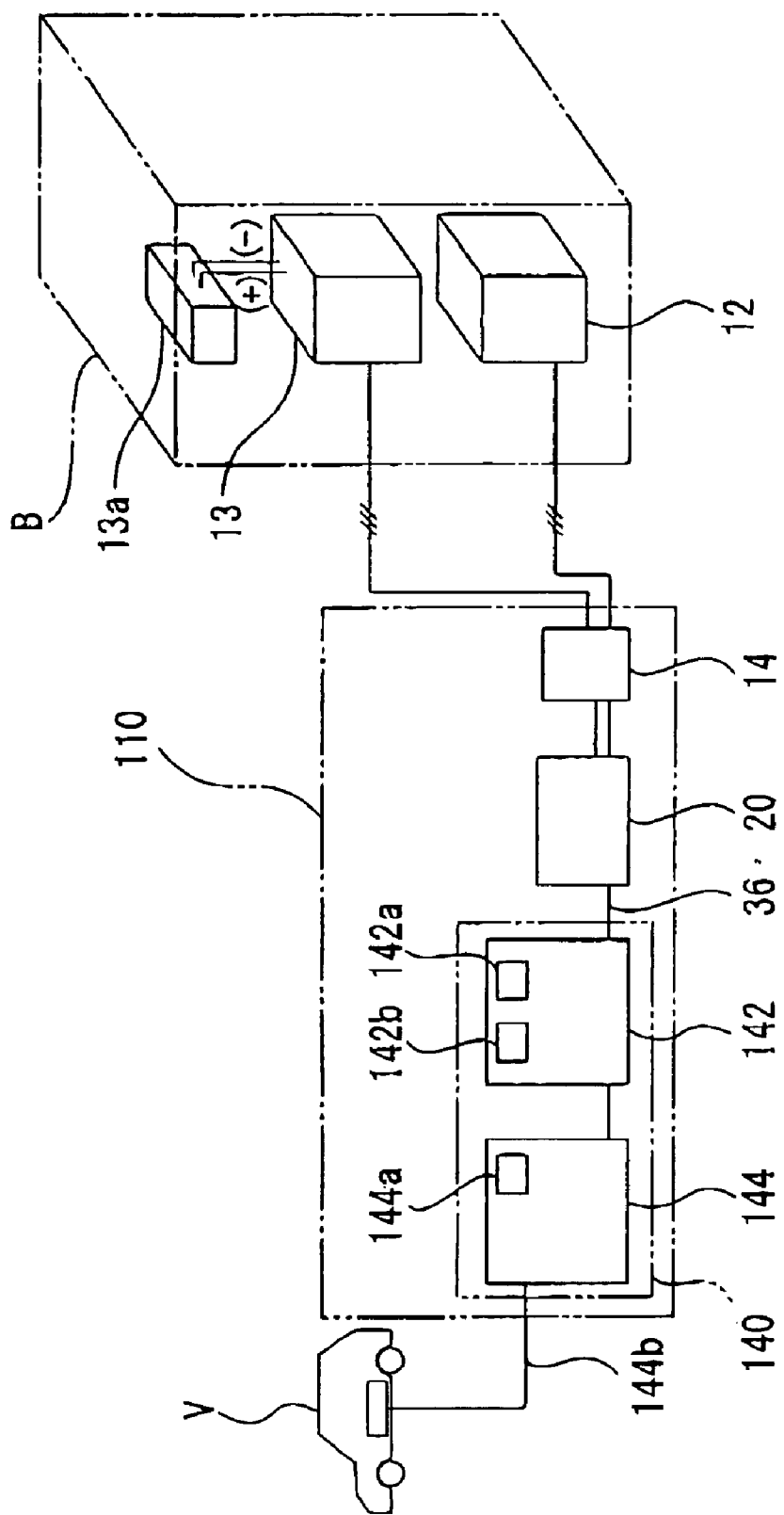
FIG. 5 is a block diagram schematically illustrating the application example 1 of the loading device according to the embodiment of the present invention.

FIG. 5 illustrates the first application example of the above embodiment. In this example, the same reference characters are used for the same parts and the equal parts as the first embodiment, and the detailed descriptions will be omitted.

As shown in FIG. 5, a facility B is provided with the alternating-current generator 12 as the objective power source to be tested and an UPS (Uninterruptible Power System) 13 having a battery 13a. When power failure such as electric power outage occurs, the alternating current is supplied to the entire facility B by using the alternating-current generator 12 and the UPS 13.

A loading device 110 is a so-called permanent installation type (stationary type) disposed in the facility B or in the vicinity of the facility B, and is exclusively disposed for conducting the loading test of the alternating-current generator 12 and the UPS 13 of the facility B.

The resistor 20 of the loading device 110 is connected to the alternating-current generator 12 through the rectifier 14, and the direct current is applied to the resistor 20 from the rectifier 14. Therefore, the loading test of the alternating-current generator 12 can be carried out.

The resistor 20 is connected to the UPS 13 through the rectifier 14. Therefore, the loading test of the UPS 13 can be carried out. The alternating-current from the UPS 13 is converted into the direct current by the rectifier 14, and this direct current is supplied to the resistor 20.

Accordingly, by using the loading device 110, the loading test can be performed not only for the alternating-current generator 12 generating the alternating-current, but also the UPS 13 and the battery 13a for generating the direct current.

In this first application example, the hydrogen storage device 140 comprises a hydrogen storage device 142 having a hydrogen compressor 142a and a high pressure gas container 142b and a dispenser unit 144 having a pressure control device 144a and a filling hose 144b.

More particularly, in the loading device 110, the hydrogen $H_2$ collected in the resistor 20 is compressed by the hydrogen compressor 142a, and then is sorted in the high pressure gas container 142b. The dispenser unit 144 can fill the stored hydrogen $H_2$ to a hydrogen-fueled car through the filling hose 144b.

As stated above, in this application example 1, since the loading device 110 is adopted as the permanent installation type (stationary type), it is preferable for the facility B in which the especially large alternating-current generator (objective power source to be tested) 12 and UPS (objective power source to be tested) such as a pump station and a factory are disposed.

In the loading device 110, the electric power consumed in the resistor 20 can be converted into the chemical energy by collecting the hydrogen $H_2$, and the electric power to be consumed in the resistor 20 can be used. More particular, in the conventional device, the electric power is consumed in the water rheostat as heat, so that the electric power is not used. However, it the present invention, the electric energy to be consumed in the water rheostat is converted into the chemical energy, so that this chemical energy can be used.

In addition, if the loading device 110 of such a permanent installation type is disposed in many facilities, amount of the electric energy, which can be used in accordance with the number of the installations, increases, contributing to curve the global warming.

Since the loading device 110 supplies the hydrogen $H_2$ to the hydrogen-fueled car, the global warming and air pollution can be reduced. In other words, the hydrogen only generates water without emitting carbon monoxide, carbon hydride, nitrogen oxide, and the like after burning, so that the hydrogen is considered as a highly clean fuel. Moreover, it has been considered that producing the hydrogen is economically very difficult. However, according to the present invention, the hydrogen is generated and collected by using the electric power consumed in the resistor, which has not been conventionally used, so that the hydrogen can be easily produced at a low price.

APPLICATION EXAMPLE 2

Figure 6:
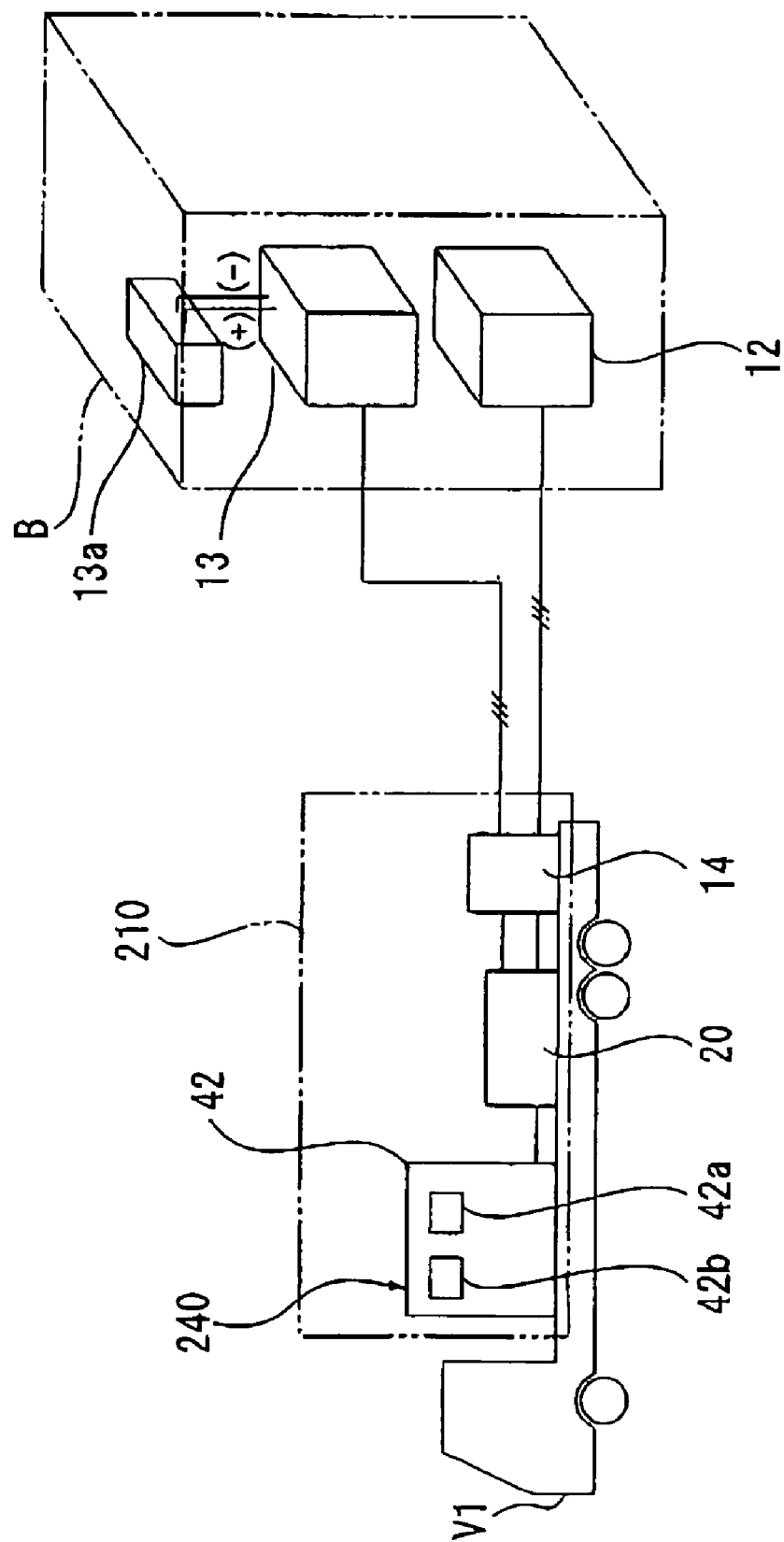
FIG. 6 is a block diagram schematically illustrating the application example 2 of the loading device according to the embodiment of the present invention.
Figure 7:
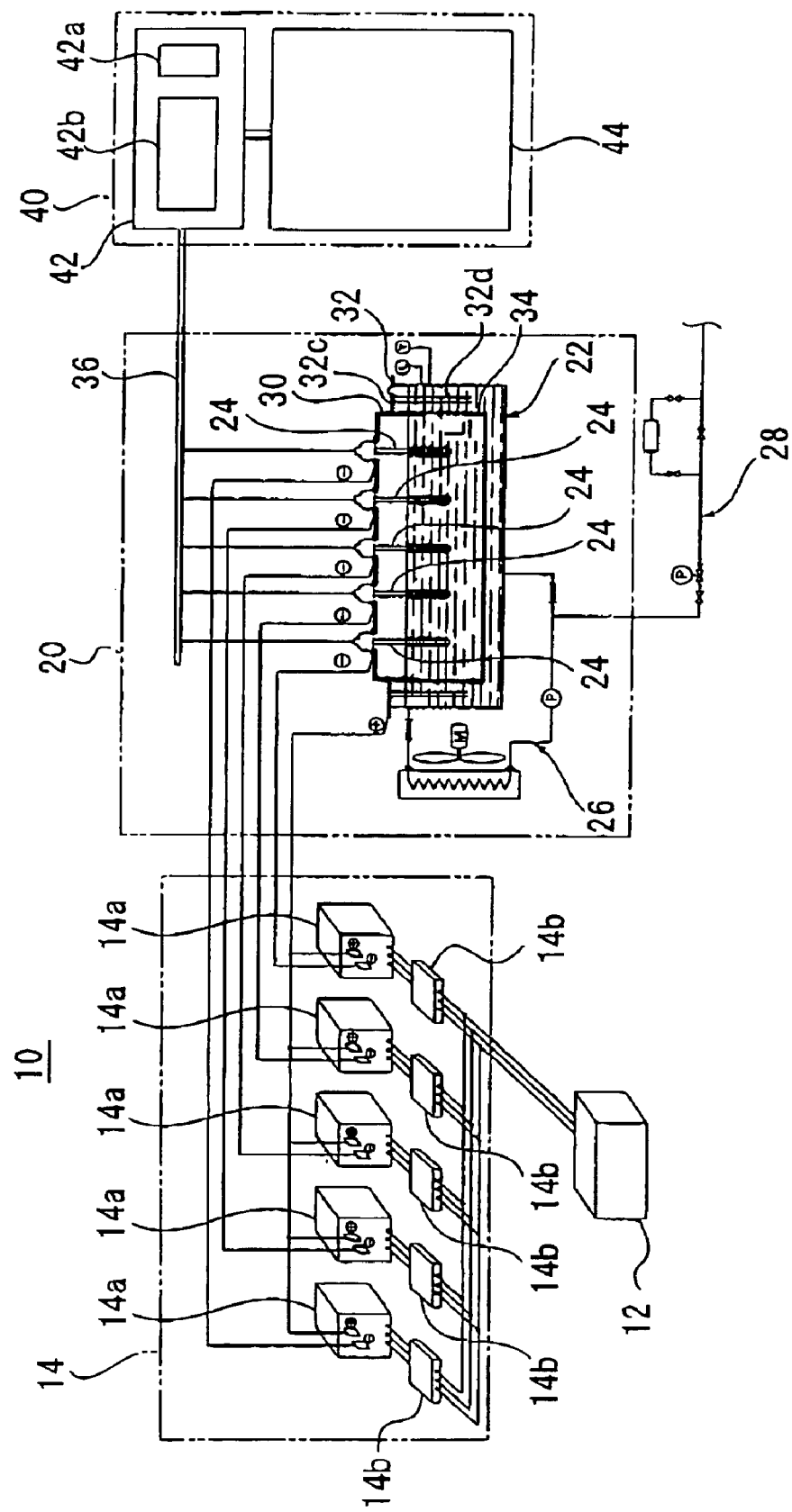
FIG. 7 is a block diagram schematically illustrating the application example 3 of the loading device according to the embodiment of the present invention.
Figure 8:
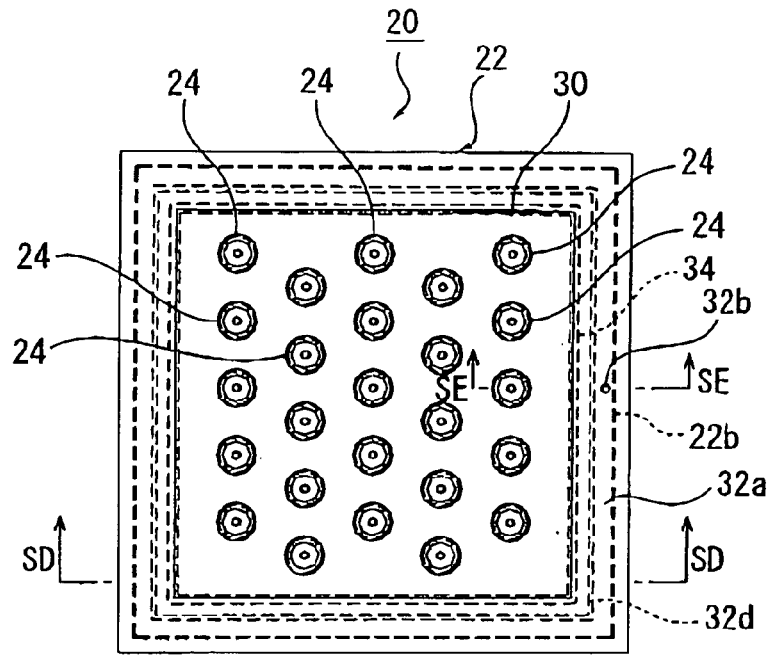
FIG. 8 is a plan view of the resistor included in the loading device of the application example 3 shown in FIG. 7.
Figure 9:
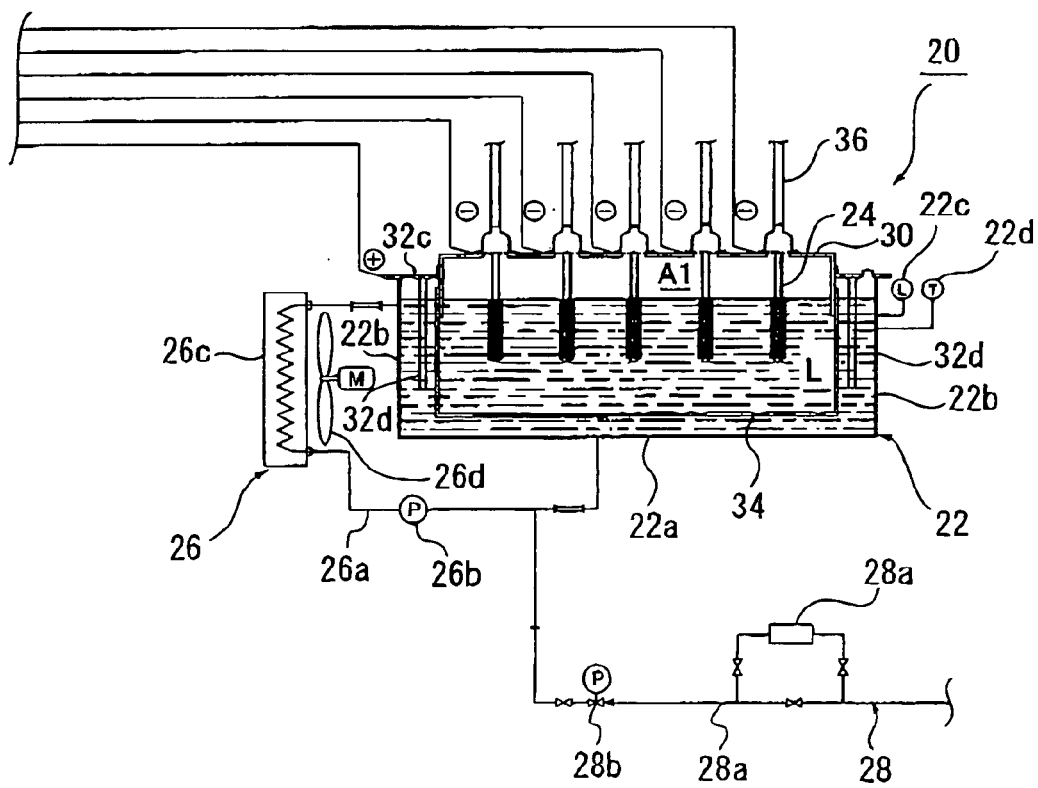
FIG. 9 is a schematic cross section view along SD-SD line in FIG. 8.

FIG. 6 illustrates the application example 2 of the above embodiment. In this example, the same reference characters are used for the same parts and the equal parts as the embodiment or the application example 2, and the detailed descriptions will he omitted.

As illustrated in FIG. 6, the loading device 210 of the application example 2 comprises the rectifier 14 to be connected to the alternating-current generator 12, the resistor 20 connected to the rectifier unit 14, and a hydrogen storage device 240 for storing the hydrogen $H_2$ collected in the resistor 20. The hydrogen storage device 240 is made of the hydrogen absorption device 42, and comprises the temperature adjusting device 42a and the hydrogen storage alloy 42b.

Moreover, the loading device 210 is placed on a vehicle V1 such as a track, for example, so that the loading device 210 can be transported.

Accordingly, the loading device 210 can be transported to desired facilities by the vehicle V1, and the loading device 210 can be used in various facilities. Therefore, the electric power conventionally consumed by converting into the heat during the loading test can be used.

Furthermore, in the loading device 210, the hydrogen storage device 240 placed on the vehicle V1 includes the hydrogen storage alloy 42b. Therefore, the hydrogen $H_2$ generated in the resistor 20 can be stabilized by storing the hydrogen $H_2$ in a short time, so it is especially preferable for the loading device of transportable type.

If TiMnVFe, TiCrV, and the like are adopted as the hydrogen storage alloy 42b, the hydrogen can be stored by substantial ordinary temperature and ordinary pressure, so that the safety in the transportation can be further improved.

APPLICATION EXAMPLE 3

FIGS. 7 to 10 illustrate the application example 3 of the above embodiment. The same reference numerals are used for the same parts and the equal parts as the first embodiment and the application examples 1, 2.

As illustrated in FIGS. 7 to 10, an ion-exchange membrane member 34 soaked in the electrolyte aqueous solution L is installed in the outside of the hydrogen collecting member 30.

Figure 10:
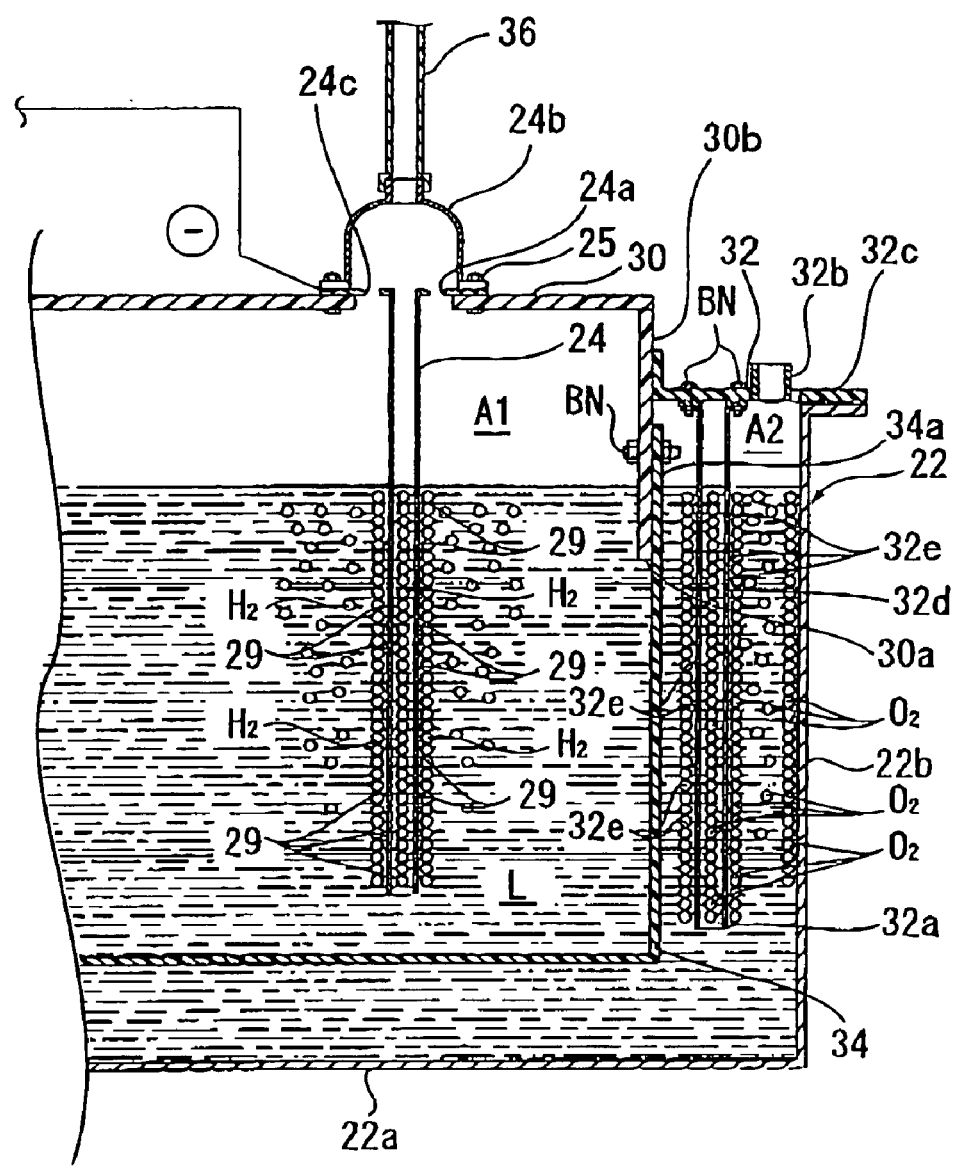
FIG. 10 is a cross section view along SE-SE line in FIG. 8.
Figure 11:
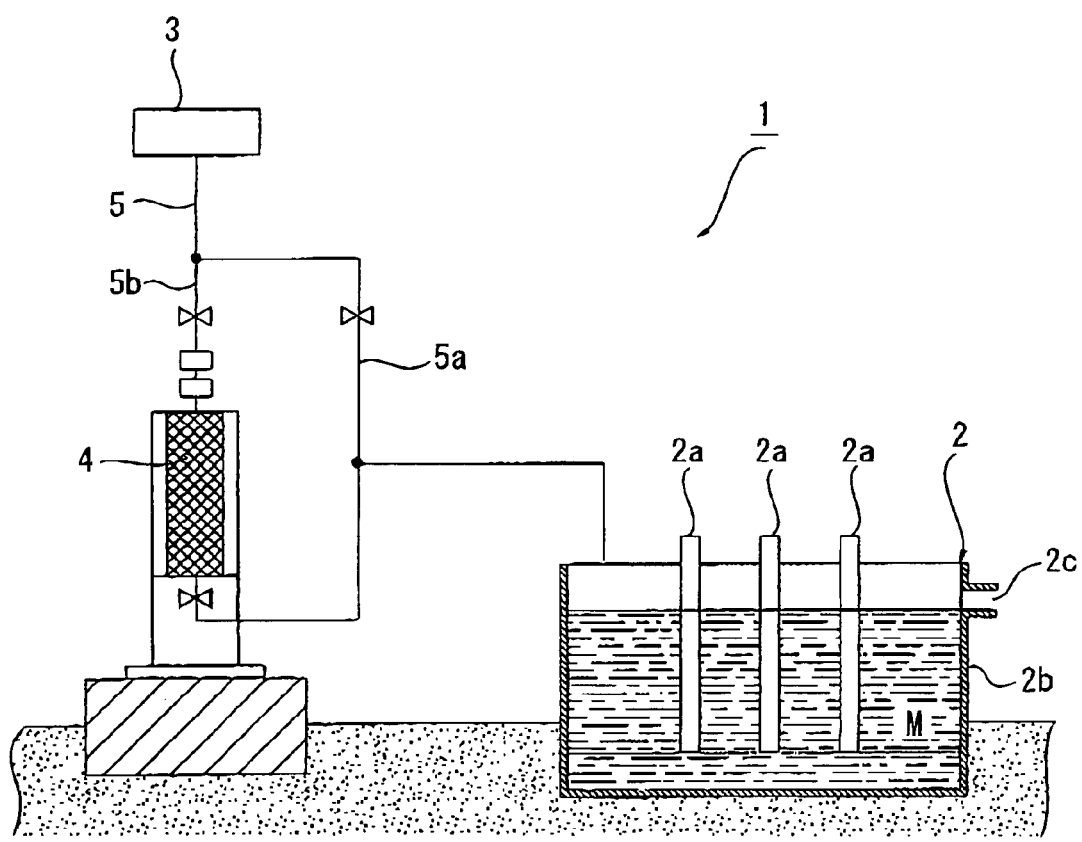
FIG. 11 is a block diagram schematically illustrating the conventional loading device.

The ion-exchange membrane member 34 is a rectangular-solid shape in which the upper part is opened. The ion-exchange membrane member 34 surrounds the electrode tubes 24 arranged in the lower part of the hydrogen collecting member 30. The upper end portion 34a of the ion-exchange membrane member 34 is fixed to a side surface portion 30b extending toward the electrolyte aqueous solution L of the hydrogen collecting member 30 by a bolt or nut BN as shown in FIG. 10.

The upper end portion 34a of the ion-exchange membrane member 34 projects from the electrolyte aqueous solution L, and exposes in the air.

The ion-exchange membrane member 34 is the membrane selectively permeable to positive ion or negative ion. Here, the ion-exchange membrane member 34 is a negative ion-exchange membrane member which is not permeable to hydrogen ion to be the hydrogen $H_2$ generated from the electrode tubes 24.

The electrode tube 24 shown in FIGS. 7 to 10 is a hollow tubular shape whose both ends are opened, comprising a conductive metal material such as stainless steel, for example. The portion of the electrode tube 24 from its intermediate part soaked in the electrolyte aqueous solution L to its lower end part is a net like shape having many holes 29 (reference to FIG. 10).

The oxygen collecting member 32 comprises an upper wall part 32c for covering the upper part of the electrolyte aqueous solution L and a soaked portion 32b extending from the upper wall part 32c toward the lower part.

The upper wall part 32c is bridged between the side wall 22b of the retention tank 22 and the hydrogen collecting member 30, and is provided with the opening for taking out oxygen 32b in the vicinity of the side wall 22b. The upper wall part 32c is formed by an insulation member similar to the material of the hydrogen collecting member 30.

The soaked portion 32d is disposed between the opening for taking out oxygen 32b and the hydrogen collecting member 30, and is fixed to the upper wall part 32c by a bolt or nut BN. The soaked portion 32d is made of a conductive metal material such as stainless steel, for example, and is a hollow tube shape. The lower end 32a is soaked in the electrolyte aqueous solution L, and the portion of the soaked portion 32d soaked in the electrolyte aqueous solution L is a net-like shape having many holes 32e.

Moreover, the soaked portion 32d is electrically connected to the side wall 22b of the retention tank 22, and is configured to operate as the same electrode as the retention tank 22, i.e., anode (positive electrode).

As stated above, since the ion-exchange member 34 for surrounding the electrode tube 24 is disposed in the outside of the hydrogen collecting member 30, the hydrogen ion to be the hydrogen $H_2$ generated from the electrode tube 24 can not penetrate the ion-exchange membrane member 34. On the other hand, the oxygen ion to be the oxygen generated from the side wall 22a of the retention tank 22 and the soaked portion 32d of the oxygen collecting member 32 can not penetrate the ion-exchange membrane member 34.

Therefore, the oxygen and the hydrogen to be generated from the water decomposed by an electric current are separated by this ion-exchange membrane member 34, so that the hydrogen and the oxygen having high purity can be collected by preventing the mixture of the oxygen and the hydrogen.

Moreover, since the portion of the electrode tube 24 soaked in the electrolyte aqueous solution L is formed in a hollow net-like shape having many holes 29, the surface area of the electrode tube 24 can be larger. Therefore, the electrolysis of water can be encouraged, and then more hydrogen can be obtained.

Since the oxygen collecting member 32 comprises the upper wall part 32c covering the upper portion of the electrolyte aqueous solution L and the soaked portion 32d extending from the upper wall part 32c to the lower part and soaked in electrolyte aqueous solution L, and also operates as the positive electrode which is the same electrode as the retention tank 22, the oxygen collecting member 32 not only collects the oxygen but also further encourages the electrolysis of water by operating as the positive electrode. Therefore, more oxygen can be generated and collected.

In addition, since the portion of the soaked portion 32d soaked in the electrolyte aqueous solution L is formed in the hollow net-like shape having many holes 32e, the surface area of the soaked portion 32d becomes large. Therefore the electrolysis of water is further encouraged, and then more oxygen can be collected.

As described above, the embodiment of loading device according to the present invention is described including its application examples. However, the specific structure is not limited to this embodiment. If modifications to the described embodiment are made without departing from the scope of the present invention, these are included in the present invention.

For example, the electrode member is constructed by the electrode tube 24 in the above embodiment. The electrode tube 24 does not always have to be a tubular shape, and it can be appropriately selected.

It may be possible for the retention tank and the electrode member to palatinate. Accordingly, the permanence of the retention tank and the electrode member can be improved.

Furthermore, it is not always necessary for the water temperature gauge and level meter to be disposed. For example, in the loading device of the present invention, the calorific value is small because the electric power consumed in the resistor is used for the electrolysis of water. Consequently, it is possible to prevent the increase in the temperature of the electrolyte aqueous solution L by appropriately activating the cooling system.

According to the loading device of the present invention, the resistor comprises the retention tank for collecting the electrolyte aqueous solution and the electrode member soaked in the electrolyte aqueous solution. Since the positive electrode of direct current from the rectifier is connected to the retention tank and the negative electrode of the direct current is connected to the electrode member, the electrolyte aqueous solution can be decomposed by an electric current in the resistor when the loading test of the power source is carried out.

The hydrogen collecting member forming the first space shielded from air is disposed upward in the periphery of the electrode member, so that the hydrogen generated from the electrode member can be easily collected in the first space by the hydrogen collecting member.

Therefore, according to the loading device, the hydrogen can be collected by using the electric power consumed in the resistor, so the electric power can be used.

Moreover, since the electric power consumed in the resistor is used for the electrolysis of water, most of the consumed electric power is not converted into the heat, so that the increase in the temperature of the electrolyte aqueous solution can be controlled, and the usage of cooling water can be lowered.

According to the loading device of the present invention, the loading device comprise a plurality of rectifiers and a plurality of electrode members corresponding to the plurality of-the rectifiers, so that appropriate current can be applied to the electrode member by arbitrarily choosing the number of rectifiers which is used in accordance with the scale or the test contents of the objective power source to be tested.

According to the loading device of the present invention, since the loading device comprises the hydrogen storage device for storing the hydrogen collected by the hydrogen collecting member, the hydrogen can be stored until needed, so that the flexibility of the utilization of the collected hydrogen is improved.

According to the loading device of the present invention, the hydrogen storage device includes the hydrogen storage alloy, so that a large amount of the hydrogen can be absorbed in the high density; moreover, the storage and emission of the hydrogen can be easily carried out. Therefore, the flexibility for utilizing the generated hydrogen can be further improved.

According to the loading device of the present invention, the ion-exchange membrane member surrounding the electrode member is disposed outside of the hydrogen collecting member, so that the oxygen and hydrogen generated from the water decomposed by an electric current by the electrode member are separated by the ion-exchange membrane member, and the mixture of the oxygen and the hydrogen can be prevented. Therefore, the hydrogen of a high degree of purity can be collected.

According to the loading device of the present invention, since the portion of the electrode member soaked in the electrolyte aqueous solution is formed in the hollow net-like shape, the surface area of the electrode member becomes large, and the electrolysis of water can be encouraged. Consequently, it is possible to obtain more hydrogen.

According to the loading device of the present invention, since the positive electrode is connected to the side wall of the retention tank, most of the oxygen generated from the retention tank operated as the anode can be generated from the side wall. Moreover, the oxygen collecting member forming the second space shielded from air is provided in the upside of the inner side of the side wall, so that the oxygen generated from the side wall can be easily collected by the oxygen collecting member.

According to the loading device of the present invention, the oxygen collecting member is the positive electrode comprising the upper wall part covering the upper part of the electrolyte aqueous solution and the soaked portion extending from the upper wall part to the lower part and soaked in the electrolyte aqueous solution, so that the oxygen collecting member not only collects the oxygen, but also operates as the anode. Therefore, the electrolysis of water is further encouraged, and more oxygen can be collected.

According to the loading device of the present invention, the oxygen collecting member is adopted as the same electrode as the retention tank, and the upper wall part is formed by the material similar to the material of the hydrogen collecting member, so that the oxygen collecting member operates as the anode, and more oxygen can be generated. In addition, since the portion of the soaked portion soaked in the electrolyte aqueous solution is formed in the hollow net like shape, the surface area of the soaked portion becomes large. Therefore, the electrolysis of water can be further encouraged, and more oxygen can be collected.

What is claimed is:

1. A loading device for conducting a loading test of an objective power source to be tested, comprising:
   a rectifier connected to the objective power source to be tested; and a resistor connected to the rectifier, the resistor including:
a retention tank for collecting electrolyte aqueous solution; and an electrode member soaked in the electrolyte aqueous solution, wherein
a positive electrode of direct current from the rectifier is connected to the retention tank, and a negative electrode of the direct current is connected to the electrode member,
a hydrogen collecting member forming a first space shielded from air is disposed upward in a periphery of the electrode member, and
a portion of the electrode member soaked in the electrolyte aqueous solution is formed in a hollow net-like shape.

2. The loading device according to claim 1 further comprising a plurality of rectifiers and a plurality of electrode members corresponding to the plurality of rectifiers.

3. The loading device according to claim 1 further comprising a hydrogen storage device to store hydrogen collected by the hydrogen collecting member.

4. The loading device according to claim 2 further comprising a hydrogen storage device to store hydrogen collected by the hydrogen collecting member.

5. The loading device according to claim 3, wherein the hydrogen storage device includes a hydrogen storage alloy.

6. The loading device according to claim 1, wherein an ion-exchange membrane member surrounding the electrode member is disposed in an outside of the hydrogen collecting member.

7. The loading device according to claim 1, wherein the positive electrode is connected to a side wall of the retention tank, and an oxygen collecting member forming a second space shielded from the air is provided in an upside of an inside of the side wall.

8. The loading device according to claim 1, wherein the oxygen collecting member is the positive electrode including an upper wall part covering an upside of the electrolyte aqueous solution and a soaked portion which extends from the upper wall part to a lower side and soaks in the electrolyte aqueous solution.

9. The loading device according to claim 7, wherein the oxygen collecting member comprises the same electrode as the retention tank, the upper wall part is formed by a member similar to the hydrogen collecting member, and a portion of the soaked part soaked in the electrolyte aqueous solution is formed in a hollow net-Like shape.

* * * * *